United States Patent
Ko

(10) Patent No.: US 6,514,392 B2
(45) Date of Patent: Feb. 4, 2003

(54) CONDUCTING ROLLER FOR AN ELECTROPLATING APPARATUS

(76) Inventor: Jason Ko, 67-1, Tung-Yuan Rd., Chungli Industrial Park, Chungli City, Taoyuan Hsien (TW)

( * ) Notice: Subject to any disclaimer, the term of this patent is extended or adjusted under 35 U.S.C. 154(b) by 49 days.

(21) Appl. No.: 09/897,550

(22) Filed: Jul. 2, 2001

(65) Prior Publication Data

US 2003/0000831 A1 Jan. 2, 2003

(51) Int. Cl.[7] ................................................. C25B 9/00
(52) U.S. Cl. ........................ 204/279; 204/199; 204/202; 204/206; 204/212
(58) Field of Search ................................ 204/199, 206, 204/202, 212, 279

(56) References Cited

U.S. PATENT DOCUMENTS

| | | | | |
|---|---|---|---|---|
| 2,652,461 A | * | 9/1953 | Klein | 204/279 |
| 2,921,893 A | * | 1/1960 | Smith | 204/206 |
| 3,374,165 A | * | 3/1968 | O'brien et al. | 204/279 |
| 3,541,083 A | * | 11/1970 | Beemer et al. | 204/224 R |
| 3,549,506 A | * | 12/1970 | Willingham | 204/279 |
| 3,839,606 A | * | 10/1974 | Paradine | 204/279 |
| 3,887,776 A | * | 6/1975 | Kanbayashi et al. | 204/279 |
| 4,036,337 A | * | 7/1977 | Arjalies et al. | 204/279 |
| 4,199,426 A | * | 4/1980 | Voegelin | 204/212 |
| 5,083,353 A | * | 1/1992 | Jacques | 204/280 |
| 5,164,059 A | * | 11/1992 | Geiermann et al. | 204/279 |
| 5,939,677 A | * | 8/1999 | Ko | 204/279 |
| 6,024,849 A | * | 2/2000 | Ko | 204/279 |
| 6,309,517 B1 | * | 10/2001 | Condra et al. | 204/279 |

\* cited by examiner

Primary Examiner—Bruce F. Bell
(74) Attorney, Agent, or Firm—Merchant & Gould P.C.

(57) ABSTRACT

A conducting roller is used in an electroplating apparatus, and includes a conductive roller body, which has two diameter-reduced end portions that are journalled within two stationary conductive sleeve units. A conductive liquid is filled within two sealed gaps between the end portions of the roller body and the sleeve units, thereby transmitting cathode current from the conductive sleeve units to the end portions of the roller body.

8 Claims, 4 Drawing Sheets

CONDUCTING ROLLER FOR AN ELECTROPLATING APPARATUS

BACKGROUND OF THE INVENTION

1. Field of the Invention

This invention relates to a conducting roller for an electroplating apparatus, more particularly to a two-input type conducting roller which has two ends that accept simultaneously electric current so as to form a uniform-diameter metal coating on a circuit board.

2. Description of the Related Art

Referring to FIG. 1, a conventional electroplating apparatus is shown to include pairs of conducting rollers 7 disposed at upstream and downstream sides of an electroplating bath 9, which contains an electrolyte. A plurality of spray tubes 91, 92 and roller units 93 are provided inside the electroplating bath 9. The spray tubes 91, 92 not only function as anodes as they are connected electrically to a power source, but also spray an electrolyte onto a horizontal circuit board 8. Each of the roller units 93 includes a plurality of upper rollers 931 and a lower roller 932 to advance the board 8 through the electroplating bath 9. The upper rollers 932 are arranged such that they will move downward by gravity to place the lowermost upper roller 931 in contact with the corresponding lower roller 932 as soon as the board 8 moves past the inlet 94 and outlet 94 of the electroplating bath 9, thereby sealing the inlet 94 and the outlet 94 and preventing the electrolyte from leaking and from staining the conducting rollers 7 provided outwardly of the electroplating bath 9.

FIG. 2 shows one conducting roller 7, which includes a rotatable conductive roller body 71 that presses against a side surface of the board 8 (see FIG. 1), and a stationary conducting rod 72 that is inserted into a chamber 711 in a left end portion of the roller body 71. The chamber 711 has two ends 712, 713, which are provided with a pair of bearing members 714, on which the conducting rod 72 is journalled. The roller body 71 is rotated by means of a gear unit 715. An annular seal 73 is sleeved on the conducting rod 72 so as to seal the chamber 711. A conductive liquid 74 is filled in the chamber 711 between the roller body 71 and the conducting rod 72. As such, electric current can be transmitted from the conducting rod 72 to the roller body 71 via the conductive liquid 74. The disadvantages of the conducting roller 7 are as follows:

(1) A resistance loss is incurred on the roller body 71, and increases gradually from the left end to the right end in view of the condition that only a single cathode current input is provided to the left end of the roller body 71, thereby resulting in an uneven thickness of metal coating on the board 8.

(2) The conductive liquid 74 is normally made of mercury, which is highly poisonous, thereby resulting in serious environmental protection problems caused during filling and throwing-away thereof. Thus, it is desirable to reduce the amount of the conductive liquid 74 used in the roller body 71. However, because the conducting rod 72 is relatively long, a substantial amount of the conductive liquid 74 needed to fill in the chamber 711.

SUMMARY OF THE INVENTION

An object of this invention is to provide a two-input type conducting roller for an electroplating apparatus, which has a constant voltage value at all of the axial positions thereof so as to maintain an even distribution of cathode current to an electrolyte, thereby forming effectively a uniform-diameter metal coating on a circuit board.

Another object of this invention is to provide a two-input type conducting roller for an electroplating apparatus, which needs only a small amount of conductive liquid to be used therein.

According to this invention, a conducting roller is used in an electroplating apparatus, and includes a conductive roller body, which has two diameter-reduced end portions that are journalled within two stationary conductive sleeve units. A conductive liquid is filled within two sealed gaps between the end portions of the roller body and the sleeve units, thereby transmitting cathode current from the conducting sleeve units to the end portions of the roller body.

Because cathode current is input simultaneously to the end portions of the roller body, the voltage value of the roller body is constant at all of the axial positions thereof such that a uniform-diameter of metal coating can be formed on a circuit board.

Furthermore, the sealed gaps are relatively small such that the amount of the conductive liquid required to be used in the conducting roller can be reduced.

BRIEF DESCRIPTION OF THE DRAWINGS

These and other features and advantages of this invention will become apparent in the following detailed description of a preferred embodiment of this invention, with reference to the accompanying drawings, in which.

DETAILED DESCRIPTION OF THE PREFERRED EMBODIMENT

Figure 1:
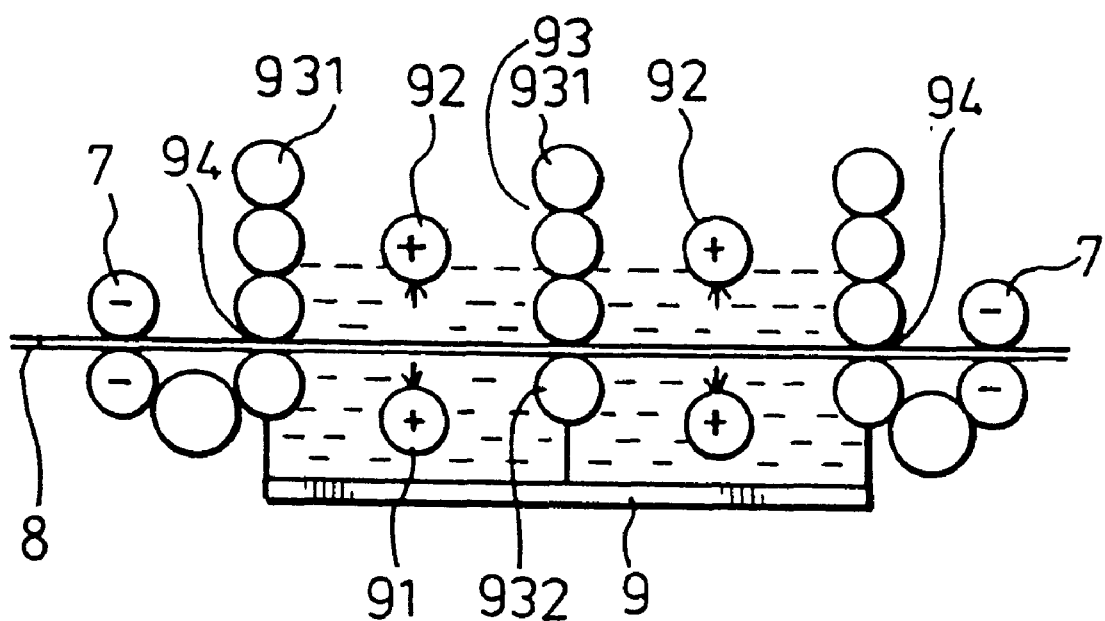
FIG. 1 is a schematic view of a conventional electroplating apparatus.
Figure 2:
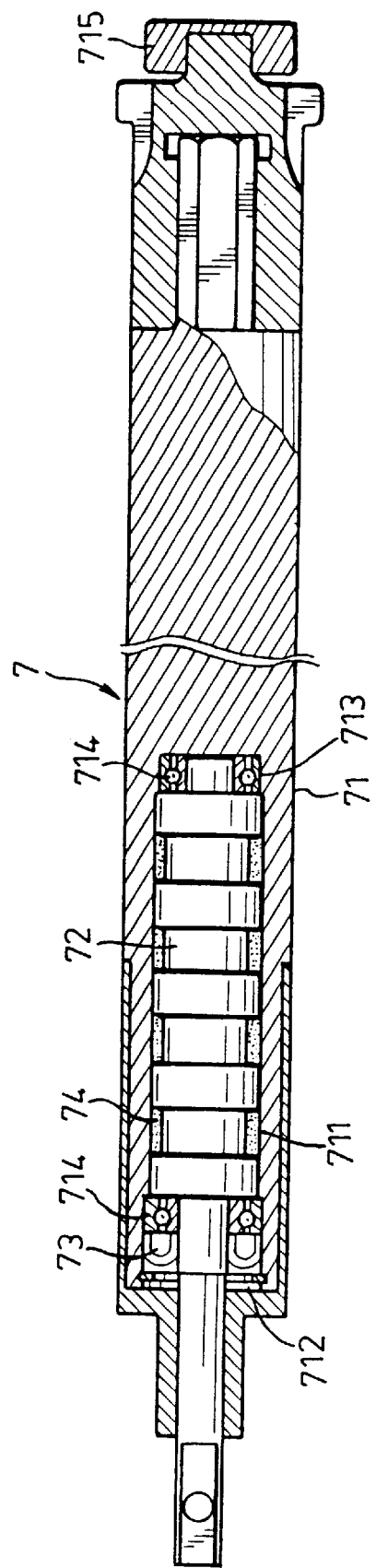
FIG. 2 is a sectional view of a conducting roller of the conventional electroplating apparatus.
Figure 3:
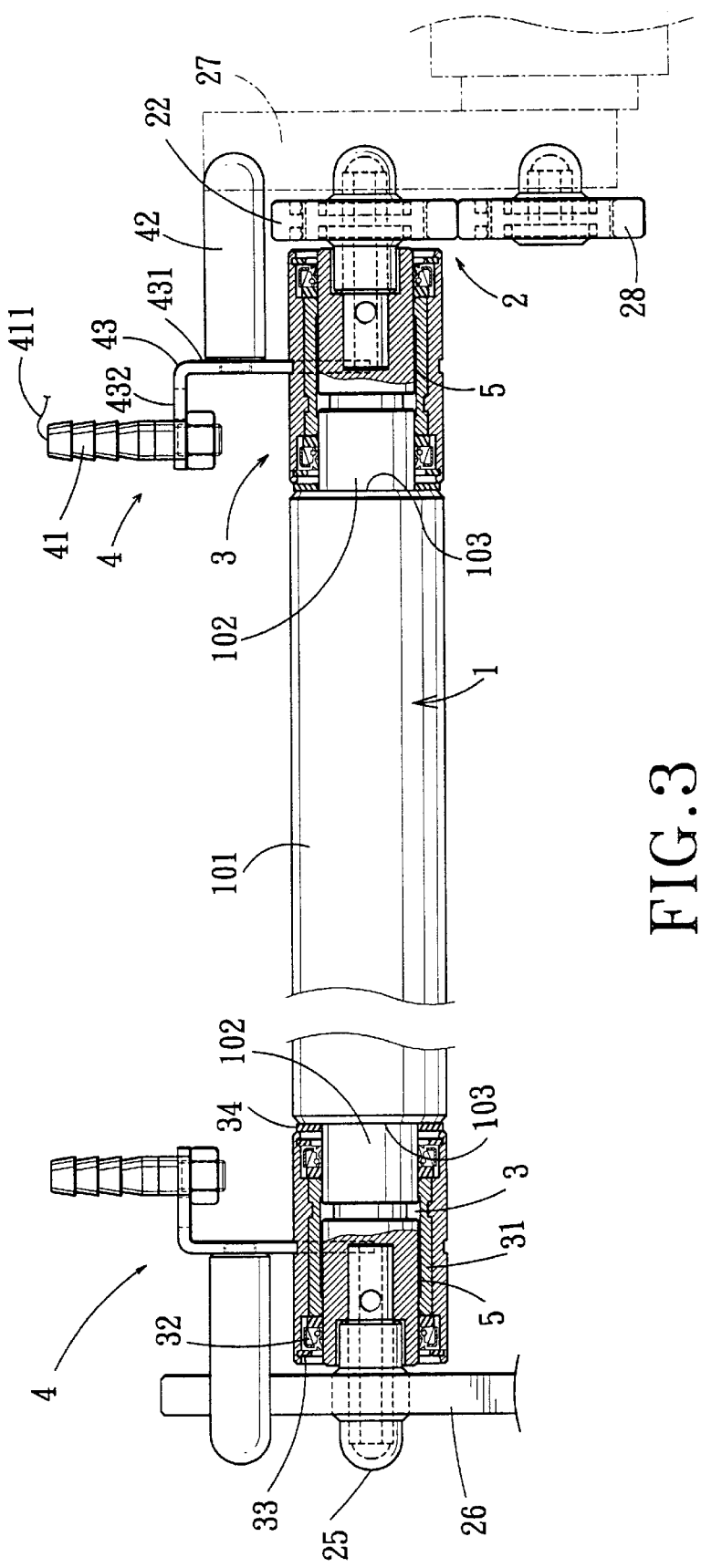
FIG. 3 is a schematic view of the preferred embodiment of a two-input type conducting roller for an electroplating apparatus.
Figure 4:
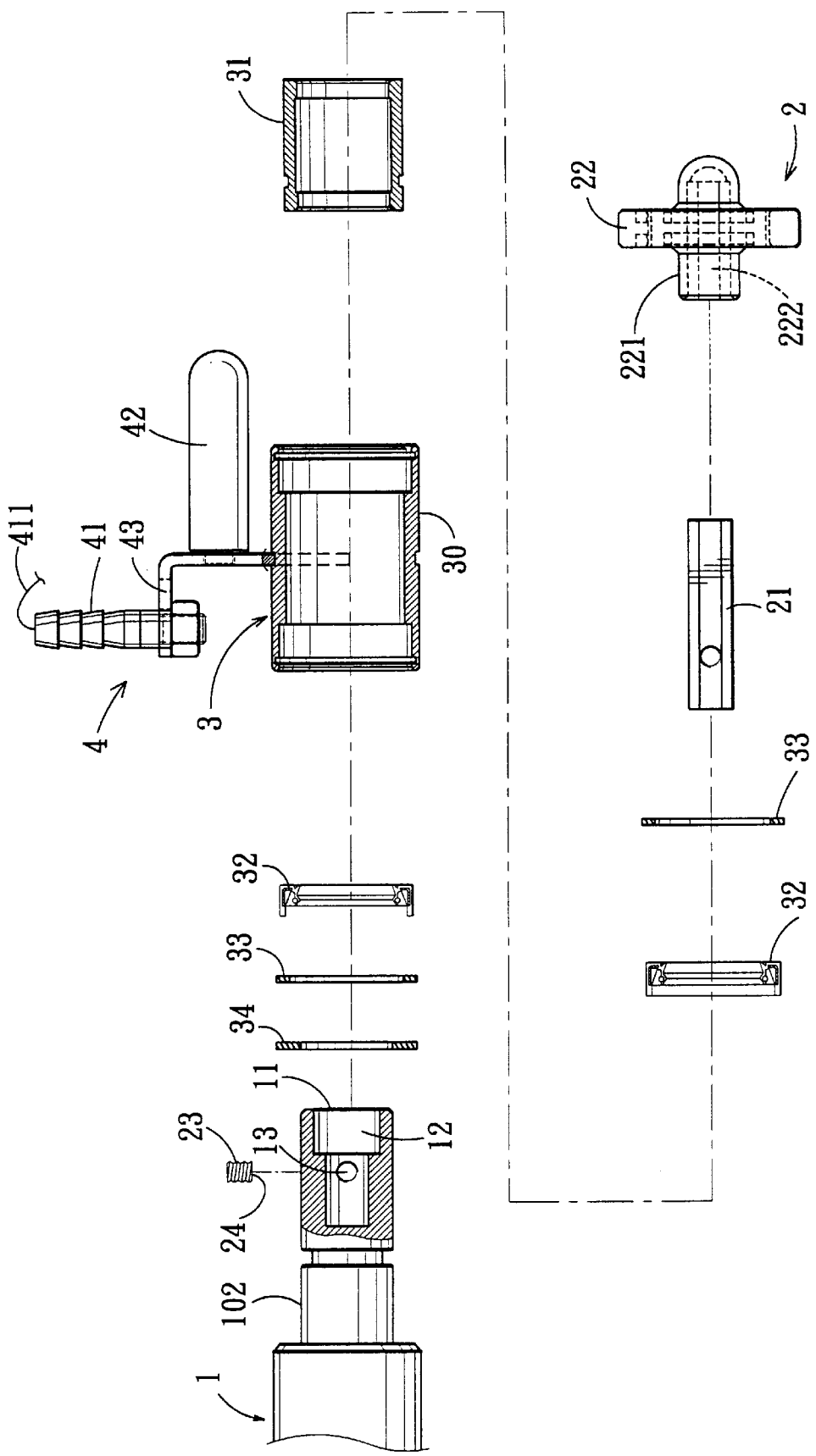
FIG. 4 is an exploded, fragmentary, partly sectional view of the preferred embodiment.

Referring to FIGS. 3 and 4, the preferred embodiment of a two-input conducting roller for an electroplating apparatus is shown to include a roller body 1, a driven gear unit 2, a pair of conductive sleeve units 3, and a pair of stationary conducting seats 4. The conducting roller is horizontal, and has a left end supported on a support rod 25 that is disposed on a left stationary member 26, and a right end journalled on a right stationary member 27.

The roller body 1 has a uniform-diameter middle portion 101 in frictional contact with a top or bottom side surface of a horizontal circuit board (not shown) to be electroplated, two diameter-reduced end portions 102, and two shoulders 103 that are defined between the middle portion 101 and the end portions 102.

The driven gear unit 2 includes a horizontal connecting rod 21 and a gear member 22 that is formed with an integral horizontal rotating shaft 221. The connecting rod 21 is disposed within the right sleeve unit 3, and has a left end that is fixed within a hole 12 in an end surface 11 of the right end portion 102 of the roller body 1, and a right end that is connected fixedly to the rotating shaft 221 of the gear member 22. A driving gear 28 is disposed rotatably on the right stationary member 27, and meshes with the gear member 22 so as to rotate the gear member 22. In this embodiment, the gear member 22 is positioned between the roller body 1 and the right stationary member 27. The rotating shaft 22 has a right end that is journalled on the right stationary member 27, and a left end surface that is formed with a hexagonal bore 222. The connecting rod 21 has a hexagonal cross-section, and engages fittingly the bore 222 in the rotating shaft 22, thereby permitting synchronous rotation therewith. The right end portion 102 of the roller body 1 is formed with three radially extending threaded holes 13 (only one is shown in FIG. 4), which are angularly equidistant. Three lock bolts 23 (only one is shown in FIG. 4) engage the threaded holes 13, respectively, and have radial inner ends 24 that press against the connecting rod 21, thereby locking the left end of the connecting rod 21 within the hole 12 in the right end portion 102 of the roller body The sleeve units 3 are disposed respectively on the end portions 102 of the roller body 1. Each of the sleeve units 3 consists of a conductive sleeve element 30 and a conductive bushing 31, and is associated with a sealing unit, which includes two annular seals 32 and two retaining rings 33, and two spacer rings 34. All of the seals 32, the retaining rings 33 and the spacer rings 34 are sleeved on the end portions 102 of the roller body 1. The sleeve elements 30 are connected respectively, fixedly, and electrically to the conducting seats 4. Each of the bushings 31 is disposed between the corresponding sleeve element 30 and the corresponding end portion 102 of the roller body 1. In each of the sleeve units 3, the seals 32 press against two ends of the bushing 31 by means of the retaining rings 33, and are located on two sides of the bushing 31 so as to define a sealed annular gap between the sleeve element 30 and the end portion 102 of the roller body 1 and between the seals 32. The sleeve elements 30 are sleeved intimately on the bushings 31 for electrical connection therewith. A conductive liquid 5 is filled within the sealed gaps between the sleeve elements 30 and the end portions 102 of the roller body 1 so as to transmit cathode current from the conducting seats 4 to the end portions 102 of the roller body 1. The spacer rings 34 are disposed between the sleeve elements 30 and the shoulders 103 of the roller body 1, thereby preventing contact between the shoulders 103 and the sleeve elements 34.

The support rod 25 is disposed rotatably on the left stationary member 26, and is coupled with the roller body 1 and the left sleeve unit 3 in a manner, in which the connecting rod 21 is connected to the roller body 1 and the right sleeve unit 3.

Each of the conducting seats 4 includes a vertical terminal pin 41, a horizontal fixing rod 42, and an L-shaped conducting plate 43. The terminal pins 41 are connected electrically to a negative side of a power supply (not shown) via an electric wire 411. Each of the L-shaped conducting plate 43 has a vertical plate portion 431 that is fixed to and that is in electrical connection with the corresponding sleeve element 30, and a horizontal plate portion 432 that is formed integrally with an upper end of the vertical plate portion 431 and that is fixed to the terminal pin 41 for electrical connection therewith. The fixing rod 42 has one end that is connected fixedly to the conducting plate 43, and another end that is connected fixedly to the corresponding stationary member 26, 27, thereby fixing the conducting seats 4 relative to the stationary members 26, 27.

Since the cathode current is input simultaneously to the left and right end portions 102 of the roller body 1, the roller body 1 has a constant voltage value at all of the axial positions thereof so as to distribute evenly the cathode current into an electrolyte in an electroplating bath (not shown), thereby forming a uniform-diameter metal coating on the circuit board (not shown).

Furthermore, since the annular gaps between the sleeve units 3 and the roller body 1 are relatively short and thin, only a relatively small amount of conductive liquid is required to fill the same.

With this invention thus explained, it is apparent that numerous modifications and variations can be made without departing the scope and spirit of this invention. It is therefore intended that this invention be limited only as indicated by the appended claims.

I claim:

1. A horizontal conducting roller for an electroplating apparatus, said apparatus including two stationary members for journalling said conducting roller therebetween, and a driving gear that is disposed rotatably relative to the stationary members, said conducting roller comprising:

a conductive roller body having a uniform-diameter middle portion, two diameter-reduced end portions, and two shoulders defined between said middle portion and said end portions;

a driven gear unit connected fixedly to one of said end portions of said roller body and adapted to engage the driving gear so that rotation of the driving gear can be transferred to said roller body via said driven gear unit;

a pair of stationary conductive sleeve units, within which said end portions of said roller body are journalled respectively, each of said sleeve units and a respective one of said end portions of said roller body defining a sealed annular gap that is filled with a conductive liquid so as to establish an electrical connection therebetween; and a pair of conducting seats respectively in electrical connection with said sleeve units;

whereby, electrical current can transmitted from said conducting seats to said end portions of said roller body via said sleeve units and said conductive liquid.

2. The horizontal conducting roller as claimed in claim 1, wherein said one of said end portions of said roller body has an end surface that is formed with a hole, said driven gear unit including a horizontal connecting rod and a gear member that is formed with an integral horizontal rotating shaft, said connecting rod being disposed within one of said sleeve units and having one end that is fixed within said hole in said roller body, and another end that is connected fixedly to said rotating shaft of said gear member.

3. The horizontal conducting roller as claimed in claim 2, wherein said gear member is adapted to be positioned between said roller body and one of the stationary members, said rotating shaft of said gear member having an end surface that is formed with a horizontal hexagonal bore, said connecting rod having a hexagonal cross-section and engaging fittingly said bore in said rotating shaft of said gear member, thereby permitting synchronous rotation therewith.

4. The horizontal conducting roller as claimed in claim 3, wherein said one of said end portions of said roller body further includes a plurality of radially extending threaded holes, which are angularly equidistant, said conducting roller further including a plurality of lock bolts, which engage respectively said threaded holes and which press against said connecting rod, thereby locking said connecting rod within said hole in said roller body.

5. The horizontal conducting roller as claimed in claim 1, wherein each of said sleeve units includes:

a conductive sleeve element connected electrically to a respective one of said conducting seats; and a conductive bushing disposed between said sleeve element and a respective one of said end portions of said roller body so as to define said sealed gaps between said end portions of said roller body and said bushings of said sleeve units, said sleeve elements being sleeved intimately on said bushings for electrical connection therewith.

6. The horizontal conducting roller as claimed in claim 5, further comprising two sealing units, which are associated respectively with said sleeve units, each of said sealing units including:

two annular seals sleeved on said roller body so as to define a respective one of said sealed gaps between said seals; and two retaining rings sleeved on said roller body so as to press said seals against two ends of said bushing of a respective one of said sleeve units, thereby preventing movement of said seals on said roller body.

7. The horizontal conducting roller as claimed in claim 5, further comprising two spacer rings, each of which is disposed between a respective one of said sleeve elements and a respective one of said shoulders of said roller body, thereby preventing contact between said shoulders and said sleeve elements.

8. The horizontal conducting roller as claimed in claim 1, wherein each of said conducting seats includes:

a vertical terminal pin adapted to be connected electrically to a negative side of a power supply;

an L-shaped conducting plate having a vertical plate portion that is fixed to and that is in electrical connection with a respective one of said sleeve units, and a horizontal plate portion that is formed integrally with an upper end of said vertical plate portion and that is fixed to said terminal pin for electrical connection therewith; and a horizontal fixing rod having one end that is connected fixedly to said conducting plate and another end that is adapted to be connected fixedly to one of the stationary members, thereby fixing said conducting seats relative to the stationary members.

* * * * *